US012564022B2

(12) United States Patent
Kim et al.

(10) Patent No.: US 12,564,022 B2
(45) Date of Patent: Feb. 24, 2026

(54) CARBON HARDMASK OPENING USING BORON NITRIDE MASK

(71) Applicant: Applied Materials, Inc., Santa Clara, CA (US)

(72) Inventors: Jeong Hwan Kim, San Jose, CA (US); Yeonju Kwak, Sunnyvale, CA (US); Qian Fu, Pleasanton, CA (US); Siyu Zhu, San Jose, CA (US); Chuanxi Yang, Los Altos, CA (US); Hang Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 780 days.

(21) Appl. No.: 17/861,691

(22) Filed: Jul. 11, 2022

(65) Prior Publication Data

US 2024/0014039 A1     Jan. 11, 2024

(51) Int. Cl.
*H01L 21/033* (2006.01)

(52) U.S. Cl.
CPC ...... *H01L 21/0332* (2013.01); *H01L 21/0335* (2013.01); *H01L 21/0337* (2013.01); *H01L 21/0338* (2013.01)

(58) Field of Classification Search
None
See application file for complete search history.

(56) References Cited

U.S. PATENT DOCUMENTS

| | | | | | |
|---|---|---|---|---|---|
| 6,326,300 | B1 * | 12/2001 | Liu | ............... | H01L 21/31138 |
| | | | | | 257/E21.252 |
| 6,521,539 | B1 * | 2/2003 | Zhou | ............. | H01L 21/31116 |
| | | | | | 257/E21.252 |
| 2001/0042917 | A1 * | 11/2001 | Pramanick | ......... | H01L 23/5226 |
| | | | | | 257/E23.161 |
| 2004/0219736 | A1 * | 11/2004 | Yoshitaka | ............ | H01L 21/314 |
| | | | | | 257/E21.264 |

(Continued)

FOREIGN PATENT DOCUMENTS

| | | | |
|---|---|---|---|
| JP | 2000133710 | A | 5/2000 |
| JP | 2005223360 | A | 8/2005 |

(Continued)

OTHER PUBLICATIONS

Application No. PCT/US2023/025876 , International Search Report and Written Opinion, Mailed on Oct. 13, 2023, 11 pages.

(Continued)

*Primary Examiner* — Roberts P Culbert
(74) *Attorney, Agent, or Firm* — Kilpatrick Townsend & Stockton LLP

(57) ABSTRACT

Exemplary semiconductor processing methods may include providing an oxygen-containing precursor to a processing region of a semiconductor processing chamber. The methods may include forming a plasma of the oxygen-containing precursor to produce oxygen-containing plasma effluents. The methods may include contacting a substrate housed in the processing region with the oxygen-containing plasma effluents. The substrate may include a boron-and-nitrogen-containing material overlying a carbon-containing material.

(Continued)

The boron-and-nitrogen-containing material comprises a plurality of openings. The methods may include etching the carbon-containing material.

17 Claims, 5 Drawing Sheets

(56) References Cited

U.S. PATENT DOCUMENTS

| | | |
|---|---|---|
| 2016/0005625 A1 | 1/2016 | Shin et al. |
| 2017/0207088 A1 | 7/2017 | Kwon et al. |
| 2019/0362785 A1 | 11/2019 | Hu et al. |
| 2020/0402808 A1 | 12/2020 | Tsai et al. |
| 2022/0157712 A1 | 5/2022 | Ho |
| 2022/0181151 A1 | 6/2022 | Shin et al. |

FOREIGN PATENT DOCUMENTS

| | | |
|---|---|---|
| JP | 2007110112 A | 4/2007 |
| JP | 2014096499 A | 5/2014 |
| JP | 2019503082 A | 1/2019 |
| JP | 2021512502 A | 5/2021 |
| TW | 1518766 B | 1/2016 |

OTHER PUBLICATIONS

Search Report for Taiwan Invention Patent Application No. 112125663 mailed Jun. 27, 2024, 10 pages.

Office Action for Taiwan Invention Patent Application No. 112125663 mailed Oct. 23, 2024, 8 pages.

Japanese Application No. 2025-500895, Office Action mailed on Dec. 16, 2025, 16 pages (8 pages of English Translation and 8 pages of original documents).

* cited by examiner

400

430

425

420

415

410

405

430

435

425

420

415

410

405

CARBON HARDMASK OPENING USING BORON NITRIDE MASK

TECHNICAL FIELD

The present technology relates to semiconductor processes and equipment. More specifically, the present technology relates to etching operations.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes a first material relative to other materials. However, wet processes may have difficulty penetrating some constrained holes and also may sometimes deform the remaining material. Dry etches produced in local plasmas formed within the substrate processing region can penetrate more constrained holes and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary semiconductor processing methods may include providing an oxygen-containing precursor to a processing region of a semiconductor processing chamber. The methods may include forming a plasma of the oxygen-containing precursor to produce oxygen-containing plasma effluents. The methods may include contacting a substrate housed in the processing region with the oxygen-containing plasma effluents. The substrate may include a boron-and-nitrogen-containing material overlying a carbon-containing material. The boron-and-nitrogen-containing material comprises a plurality of openings. The methods may include etching the carbon-containing material.

In some embodiments, the oxygen-containing precursor may be or include diatomic oxygen. The openings in the boron-and-nitrogen-containing material may be circular apertures. The substrate may include alternating layers of oxide and nitride materials. The carbon-containing material may be disposed over the alternating layers of oxide and nitride materials. The oxygen-containing plasma effluents may be formed at a source plasma power of less than or about 5,000 W. The methods may include applying a bias power while forming the oxygen-containing plasma effluents, wherein the bias power is greater than or about 2,000 W. A temperature in the semiconductor processing chamber may be maintained at between about −50° C. and about 250° C. The methods may include halting a flow of the oxygen-containing precursor, providing a fluorine-containing precursor to the processing region of the semiconductor processing chamber, forming a plasma of the fluorine-containing precursor to produce fluorine-containing plasma effluents, contacting the substrate with the fluorine-containing plasma effluents, and etching oxidized portions of the boron-and-nitrogen-containing material, oxidized portions of the carbon-containing material, or both. The fluorine-containing precursor may be or include a hydrofluorocarbon.

Some embodiments of the present technology encompass semiconductor processing methods. The methods may include i) forming a plasma of an oxygen-containing precursor to produce oxygen-containing plasma effluents. The methods may include ii) contacting a carbon-containing material with the oxygen-containing plasma effluents. A discontinuous boron-containing material may overly the carbon-containing material. The methods may include iii) selectively etching the carbon-containing material relative to a boron-containing material.

In some embodiments, a pressure may be maintained at less than or about 1 Torr. The oxygen-containing plasma effluents may be formed at a duty cycle of less than or about 70%. The etching may form a plurality of holes in the carbon-containing material. The plurality of holes may each be characterized by a circularity of less than or about 1.5. The boron-containing material may be characterized by a first thickness. The carbon-containing material may be characterized by a second thickness. The second thickness may be greater than the first thickness. The methods may include iv) forming a plasma of a fluorine-containing precursor to produce fluorine-containing plasma effluents. The methods may include v) contacting oxidized portions of the boron-containing material, oxidized portions of the carbon-containing material, or both with the fluorine-containing plasma effluents. The methods may include vi) etching oxidized portions of the boron-containing material, oxidized portions of the carbon-containing material. Operations i) through vi) may be repeated at least two times.

Some embodiments of the present technology encompass semiconductor processing methods. The methods may include providing a fluorine-containing precursor to a processing region of a semiconductor processing chamber. The fluorine-containing precursor may be or include a hydrofluorocarbon. The methods may include forming a plasma of the fluorine-containing precursor to produce fluorine-containing plasma effluents. The methods may include contacting a substrate with the fluorine-containing plasma effluents. The substrate may include a boron-and-nitrogen-containing material overlying a carbon-containing material. The boron-and-nitrogen-containing material may include a plurality of openings. The carbon-containing material may include a plurality of holes in alignment with the plurality of openings. Portions of the boron-and-nitrogen-containing material, the carbon-containing material, or both may be oxidized. The methods may include etching oxidized portions of the boron-and-nitrogen-containing material, the oxidized portions of the carbon-containing material, or both.

In some embodiments, the carbon-containing material may be a carbon-containing hardmask. The methods may include providing an oxygen-containing precursor to the processing region of the semiconductor processing chamber. The oxygen-containing precursor may be or include diatomic oxygen. The methods may include forming a plasma of the oxygen-containing precursor to produce oxygen-containing plasma effluents. The methods may include contacting the substrate housed in the processing region with the oxygen-containing plasma effluents. The methods may include etching the carbon-containing material, wherein the etching forms the oxidized portions of the boron-and-nitrogen-containing material, the oxidized portions of the carbon-containing material, or both. The plurality of holes may be characterized by a circularity of less than or about 1.5, a bow critical dimension (CD) of less than or about 125 nm, and a local critical dimension uniformity (LCDU) of less than or about 10 nm.

Such technology may provide numerous benefits over conventional systems and techniques. For example, the processes uniformly etch underlying materials without substantial clogging of the overlying material. Additionally, the operations of embodiments of the present technology may utilize less flash steps to maintain uniform etching, increasing overall throughput. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
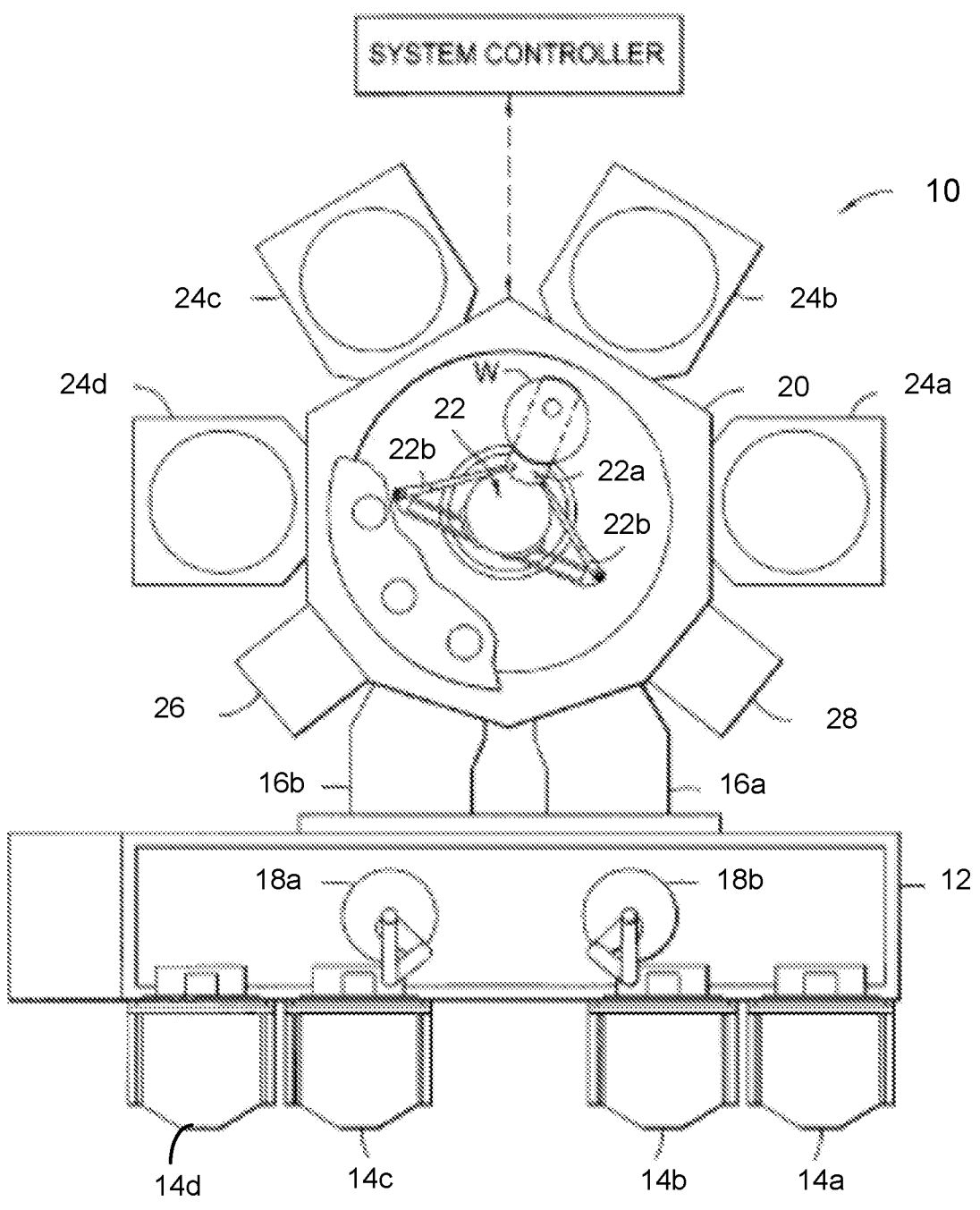
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In transitioning from 2D NAND to 3D NAND memory structures, many operations are modified from vertical to horizontal processing. Additionally, as 3D NAND structures grow in the number of cells being formed, the aspect ratios of memory holes and other structures increase, sometimes dramatically. During 3D NAND processing, stacks of placeholder layers and dielectric materials may form the inter-electrode dielectric or inter-poly dielectric ("IPD") layers. These placeholder layers may have a variety of operations performed to place structures before fully removing the material and replacing it with metal. The IPD layers are often formed overlying a conductor layer, such as polysilicon, for example. Prior to the memory holes being formed, an overlying mask must first have features etched into the material. The overlying mask may then serve as a mask for forming the memory holes in the IPD layers.

A reactive-ion etching ("ME") operation may be performed to produce the high aspect ratio features in a mask overlying the IPD layers in which memory holes will be formed. Unfortunately, this type of etching process may result in etchant materials redepositing in the mask overlying the material to be etched. The redeposition of material may block access to the underlying material to be etched.

Many conventional technologies utilize a silicon-containing material, such as SiON dielectric anti-reflective coatings, for patterning the mask overlying the IPD layers. However, while etching the mask material, the silicon-containing material is prone to clogging due to the redeposition of material, such as silicon oxide, proximate apertures in the patterned silicon-containing material. Although openings in the silicon-containing material tend to be several dozen or a hundred nanometers in cross-sectional diameter, clogging may lead to issues with the eventual formation of memory holes in IPD layers. Such clogging leads to an inconsistent and nonuniform etch of the underlying mask material. Hence, the clogging may lead to etchants being redirected and overetching the mask material proximate the clogging. To combat the clogging, flash steps may be used to remove redeposited material and maintain the circularity of the openings. However, these flash steps result in increased queue times and reduced throughput.

The present technology overcomes these issues by utilizing a boron-and-nitrogen-containing material over the mask material underlying the boron-and-nitrogen-containing material. By replacing the conventional silicon-containing material with a boron-and-nitrogen-containing material, clogging issues may be reduced. In this way, circularity and uniformity may be increased or maintained during etching. Further, decreased redeposition of material proximate openings in the boron-and-nitrogen-containing material requires the use of less flash steps, increasing overall throughput.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the single-chamber operations described. Similarly, although a specific contact cleaning operation will be described, it is to be understood that the processes may be equally applicable to other processes in which selective etching may be performed. Accordingly, the examples given should not be considered to limit the scope of the described technology.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
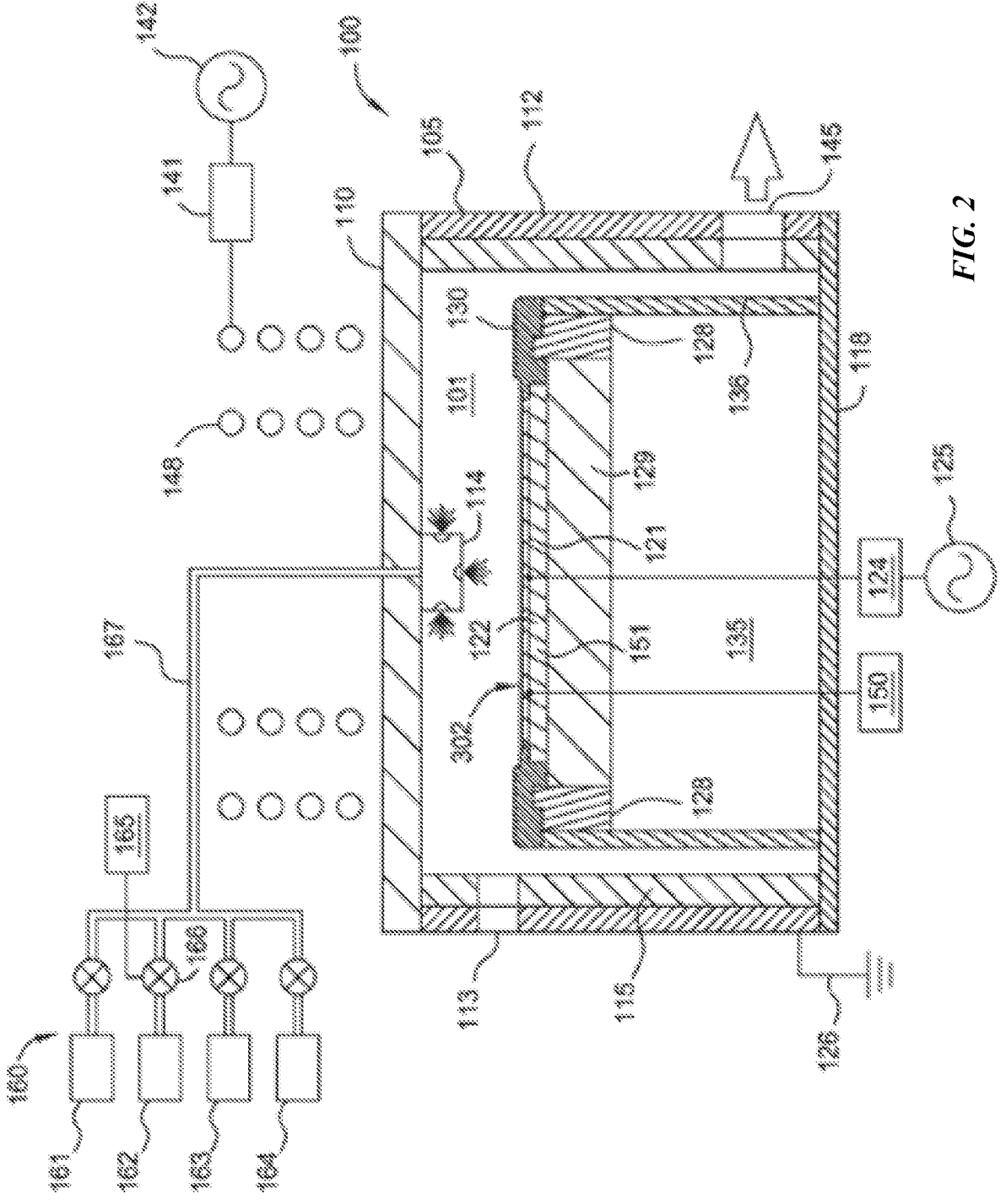
FIG. 2 shows a schematic cross-sectional view of an exemplary processing chamber according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $CF_4$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
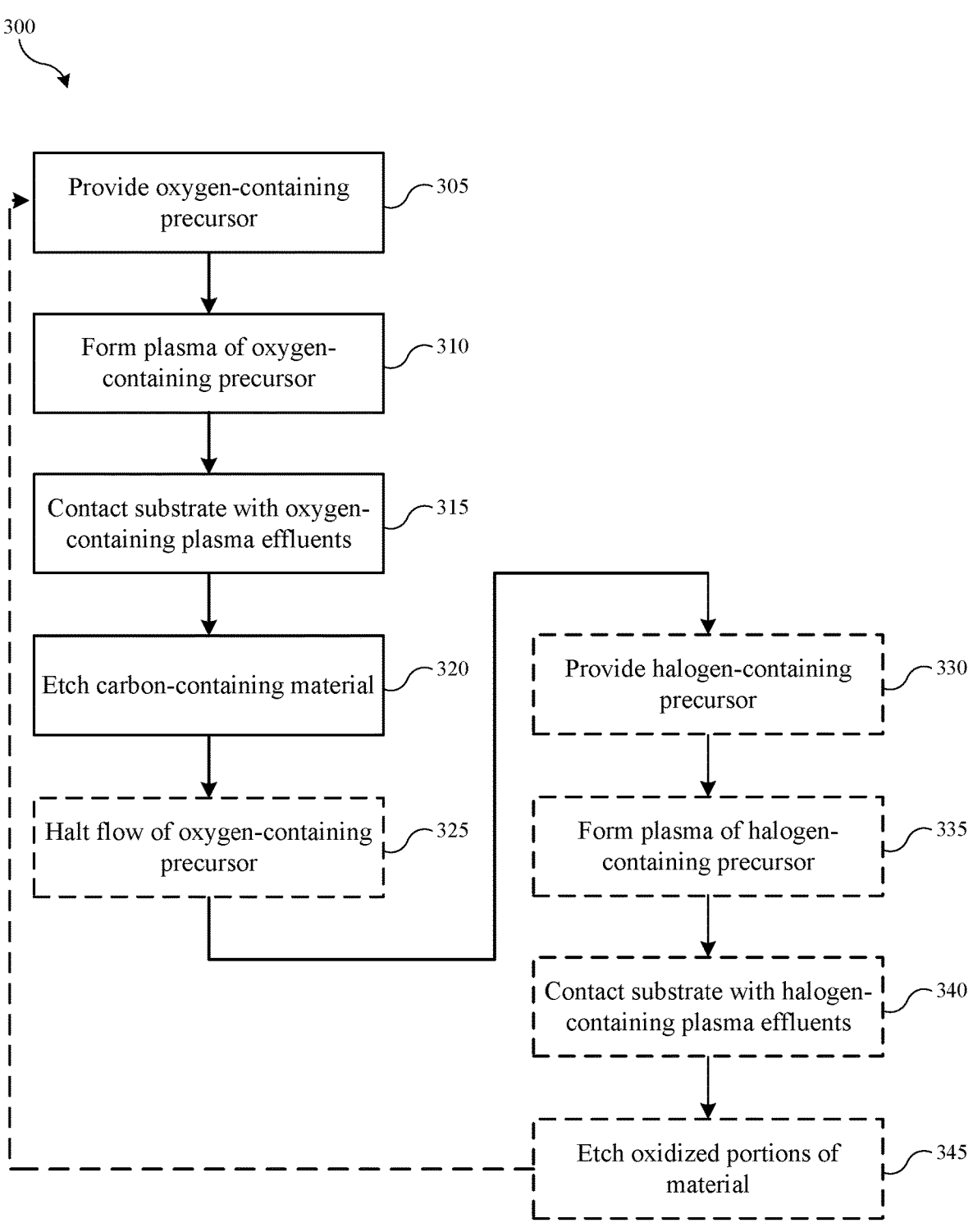
FIG. 3 shows selected operations in an etching method according to some embodiments of the present technology.

The chambers discussed previously may be used in performing exemplary methods including etching methods and treatment methods. Turning to FIG. 3 is shown exemplary operations in a method 300 according to embodiments of the present technology. Prior to the first operation of the method a substrate may be processed in one or more ways before being placed within a processing region of a chamber in which method 300 may be performed. For example, IPD layers may be formed on the substrate and one or more layers overlying the IPD layers may be processed. The IPD layers may include any number of materials, and may include alternating layers of a placeholder material and a dielectric material. In embodiments the dielectric material may be or include silicon oxide, and the placeholder material may be or include silicon nitride. Although the remaining disclosure will discuss silicon nitride and silicon oxide, any other known materials used in these two layers may be substituted for one or more of the layers. Some or all of these operations may be performed in chambers or system tools as previously described, or may be performed in different chambers on the same system tool, which may include the chamber in which the operations of method 300 are performed.

Figure 4A:
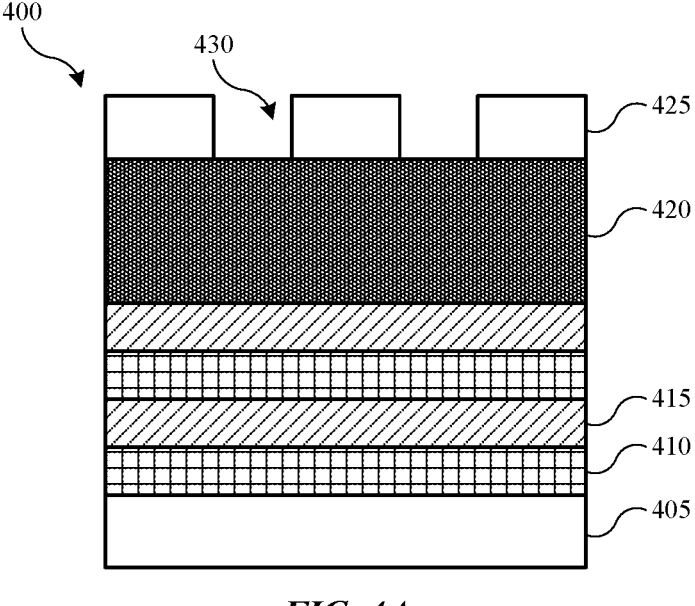
FIGS. 4A-4C illustrate cross-sectional views of substrate materials on which selected operations are being performed according to some embodiments of the present technology.
Figure 4B:
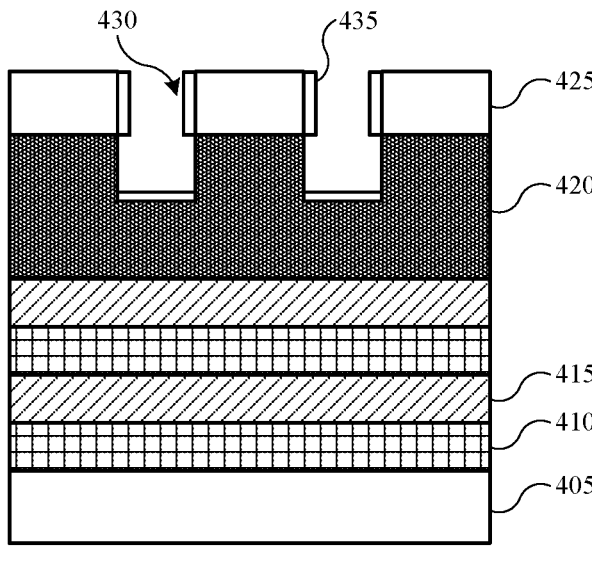
Figure 4C:
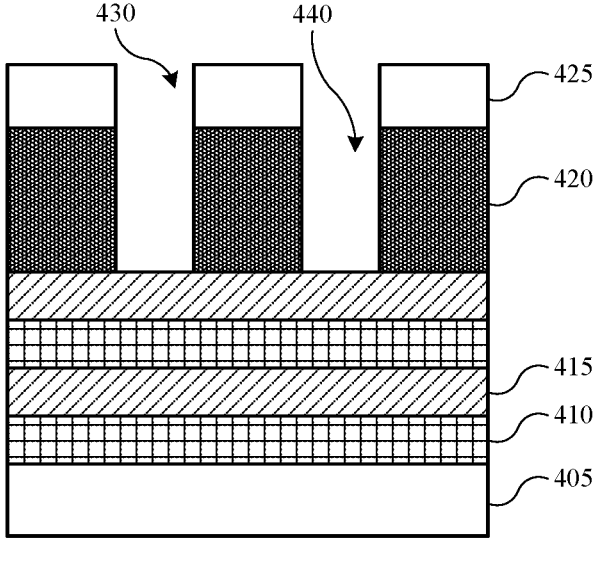

Method 300 may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below. Method 300 describes operations shown schematically in FIGS. 4A-4C, the illustrations of which will be described in conjunction with the operations of method 300. It is to be understood that FIGS. 4A-4C illustrate only partial schematic views, and a substrate may contain any number of structural sections having aspects as illustrated in the figures, as well as alternative structural aspects that may still benefit from operations of the present technology.

Method 300 may or may not involve optional operations to develop the semiconductor structure to a particular fabrication operation. It is to be understood that method 300 may be performed on any number of semiconductor structures, and FIGS. 4A-4C illustrate one exemplary structure within which an etching process may be performed. As illustrated in FIG. 4A a processed semiconductor structure 400 may include a substrate 405, which may have a plurality of stacked layers overlying the substrate, which may be a silicon-containing material, such as polysilicon, silicon germanium, or other substrate materials, and which may be conductors for contacts with subsequent metallization. As just one non-limiting example, the layers may include IPD layers including dielectric material 410, which may be silicon oxide, in alternating layers with placeholder material 415, which may be silicon nitride. Placeholder material 415 may be or include material that will be removed to produce individual memory cells in subsequent operations. Although illustrated with only four layers of material, exemplary structures may include any number of layers previously discussed, which can include dozens or hundreds of layers, and it is to be understood that the figures are only schematics to illustrate aspects of the present technology.

A mask material 420 may be formed overlying the IPD layers, and may be a carbon-containing material, such as a carbon-containing hardmask of amorphous carbon, or any other carbon-containing material that may be formed over the underlying layers during subsequent cleaning and/or etching operation. A boron-and-nitrogen-containing material 425 may be disposed over the mask material 420. The boron-and-nitrogen-containing material 425 may include a plurality of openings or apertures 430. The openings or apertures 430 may extend through an entire thickness of the boron-and-nitrogen-containing material 425, exposing the underlying mask material 420.

As shown in the figures, multiple materials may be present and exposed to etchant materials that may be used in the etching process. The method 300 may be performed to etch or remove a portion of the mask material 420, exposed within the openings 430, while minimizing etching of the boron-and-nitrogen-containing material 425. By utilizing processing conditions and precursors according to embodiments of the present technology, etching of the boron-and-nitrogen-containing material 425 may be limited or prevented during etching of mask material 420.

Method 300 may include providing an oxygen-containing precursor to a processing region of a semiconductor processing chamber at operation 305. The processing region may house a substrate, such as processed semiconductor structure 400, which may have an exposed boron-and-nitrogen-containing material, such as boron-and-nitrogen-containing material 425, and an exposed carbon-containing material, such as mask material 420, which may be a carbon-containing hardmask. The boron-and-nitrogen-containing material may be discontinuous, such that the material includes openings 430. The mask material 420 may be exposed within a recessed feature, such as opening 430, which may pose issues for conventional technologies that may simultaneously clog or close openings 430 while etching mask material 420. The openings 430 may be circular apertures.

The boron-containing material, such as boron-and-nitrogen-containing material 425, may be characterized by a first thickness. The carbon-containing material, such as mask material 420, may be characterized by a second thickness. The second thickness may be greater than the first thickness. The etching operation may be selective to the carbon-containing material, such that the features or holes etched into the carbon-containing material are formed prior to the boron-and-nitrogen-containing material 425 being completely removed.

Method 300 may also include flowing a secondary precursor into the processing region of the semiconductor processing chamber at operation 305. The secondary precursor may be, for example, a halogen-containing precursor, such as a chlorine-containing precursor.

Method 300 may include forming plasma may within the processing region of the semiconductor processing chamber at operation 310. The plasma may generate plasma effluents of the oxygen-containing precursor and, if present, the secondary precursor. Operations 305 and 310 may occur sequentially or may be performed substantially simultaneously in some embodiments. Additionally, the plasma may be formed initially from either precursor or from one or more inert precursors prior to addition of the oxygen-containing and/or secondary precursor in different embodiments.

Semiconductor structure 400 may be contacted with the plasma effluents at operation 315, which may perform an etch or removal of the mask material 420 at operation 320. As illustrated in FIGS. 4B-4C, plasma effluents may contact the semiconductor structure 400, and may contact all exposed surfaces, including surfaces to be etched, such as mask material 420, as well as surfaces to be maintained, such as boron-and-nitrogen-containing material 425. The etching at operation 320 may form features 440, which may be referred to as holes, in the mask material 420. An aspect ratio of the features 440 may be greater than or about 10:1, greater than or about 20:1, greater than or about 30:1, greater than or about 40:1, greater than or about 50:1, or greater.

Due to the nature of plasma etching, the boron-and-nitrogen-containing material 425 may be susceptible to etching, even at reduced rates relative to mask material 420. When the oxygen-containing precursor is provided, however, the local plasma may produce etchant materials that may be relatively selective to carbon material, and thus may be more likely to etch mask material 420 rather than boron-and-nitrogen-containing material 425. Accordingly, etching of the boron-and-nitrogen-containing material 425 may not be impacted, or may be impacted in limited fashion, while etching of the mask material 420 may be performed.

Precursors used in the etching processes may include an oxygen-containing precursor as well as a secondary precursor as previously described. An exemplary oxygen-containing precursor may be diatomic oxygen ($O_2$), which may be flowed into the processing region. Other sources of oxygen may be used in conjunction with or as replacements for the diatomic oxygen. For example, the oxygen-containing precursor may include one or more materials including water, diatomic oxygen, ozone, a hydroxyl-containing precursor such as hydrogen peroxide or an alcohol, nitrogen-and-oxygen-containing precursors, plasma-enhanced oxygen including locally or remotely enhanced oxygen, or any other material including oxygen that may be delivered to the processing region to facilitate the first etching operation, or any other oxygen-containing materials. The precursors may also include any number of carrier gases, which may include nitrogen, helium, argon, or other noble, inert, or useful precursors. The carrier gases may be used to dilute the precursors, which may reduce etching rates to allow adequate diffusion through the opening. Further, as previously discussed, the precursors may include a secondary precursor such as, for example, a chlorine-containing precursor or any other halogen-containing precursor.

In embodiments, the precursors may include a passivation precursor, such as carbonyl sulfide (COS). The addition of a passivation precursor may reduce bowing in the feature as material is removed. The passivation precursor may form a passivation layer 435, such as a carbon sulfide material, on the sidewalls of the feature that are resistant to etching relative to the mask material 420.

Process conditions may impact the operations performed in method 300. Each of the operations of method 300 may be performed during a constant temperature in embodiments, while in some embodiments the temperature may be adjusted during different operations. For example, the substrate, pedestal, or chamber temperature during processing may be maintained at a temperature less than or about 250° C., less than or about 200° C., less than or about 150° C., less than or about 100° C., less than or about 90° C., less than or about 80° C., and in some embodiments the temperature may be maintained less than or about 70° C., less than or about 60° C., less than or about 50° C., less than or about 30° C., less than or about 20° C., less than or about 10° C., less than or about 0° C., less than or about −10° C., or less. Maintaining the substrate, pedestal, or chamber temperatures at lower relative temperatures may minimize a bow in the feature 440 as the mask material 420 is being etched. However, as temperatures decrease, circularity of the apertures 430 and/or features 440 may also decrease. Accordingly, higher relative temperatures may increase the uniformity of the etch and re-deposition of material, which may maintain circularity of the aperture 430 and/or feature 440. Thus, in embodiments, the substrate, pedestal, or chamber temperature may be maintained at a temperature between about −50° C. and about 250° C., such as between about −30° C. and about 150° C., between about −20° C. and about 100° C., or between about −15° C. and about 50° C.

The pressure within the processing chamber may be controlled during method 300. For example, while forming the local plasma and performing the removal operation, the pressure within the processing chamber may be maintained below or about 5 Torr. Additionally, in embodiments, the pressure within the processing chamber may be maintained below or about 4 Torr, below or about 3 Torr, below or about 2 Torr, below or about 1 Torr, below or about 500 mTorr, below or about 250 mTorr, below or about 200 mTorr, below or about 150 mTorr, below or about 100 mTorr, below or about 80 mTorr, below or about 60 mTorr, below or about 50 mTorr, below or about 45 mTorr, below or about 40 mTorr, below or about 35 mTorr, below or about 30 mTorr, below or about 25 mTorr, below or about 20 mTorr, or lower, although the pressure may also be included in ranges between any two of these stated numbers or within any smaller range encompassed by any of the stated ranges. Pressure may affect critical dimension of the feature 440 being etching into mask material 420. For example, as pressure increases, not enough passivation at sidewalls of the features 440 may result in the critical dimension increasing, lateral etch may increase, and a shoulder of the boron-and-nitrogen-containing material 425 may be exhausted. Further, the pressure within the processing chamber may affect the capabilities of flow into the aperture 430. For example, as pressure increases, plasma effluents may have increased difficulty in permeating the aperture 430 to reach the underlying mask material 420. Accordingly, in some embodiments the pressure may be maintained below or about 1 Torr to allow effluent flow into the recessed feature 440 on the semiconductor structure 400.

The local plasma formed from the precursors may provide directional flow of plasma effluents to the mask material 420. Thus, the etchants may be directed into the apertures 443035, which may facilitate the effluent materials reaching the mask material 420 to perform the etch. The plasma may be a low-level plasma to limit the amount of bombardment, sputtering, and surface modification. In embodiments the plasma power may be less than or about 5,000 W, less than or about 4,500 W, less than or about 4,000 W, less than or about 3,500 W, less than or about 3,000 W, less than or about 2,500 W, less than or about 2,000 W, less than or about 1,500 W, less than or about 1,000 W, or less. By utilizing a plasma power that is, for example, about 4,000 W or less, the plasma effluents may be better controlled for delivery through the apertures 430, while limiting sputtering of other exposed surfaces.

In embodiments, a dual-frequency source of plasma power may be used to maintain circularity of the apertures 430 and/or features 440. For example, a dual-frequency source of mixed plasma power provides a high frequency power in a range from about 10 MHz to about 60 MHz, as well as a low frequency power in a range of from about 10 KHz to about 1 MHz. The second plasma source, which may provide a bias power, may be operated at similar levels as the first plasma source. However, in embodiments, the bias power may be operated at a higher level than the source power. For example, the bias power may be operated at greater than or about 2,000 W, such as greater than or about 2,500 W, greater than or about 3,000 W, greater than or about 3,500 W, greater than or about 4,000 W, greater than or about 4,000 W, greater than or about 4,500 W, or more. Increased bias power may maintain circularity and etch rate.

Additional adjustments may be made to further increase etching of deposited material along sidewalls of the features 440 by adjusting one or more characteristics of the plasma power or bias power being supplied. For example, in some embodiments both the plasma power source and bias power source may be operated in a continuous wave mode. Additionally, one or both of the power sources may be operated in a pulsed mode. In some embodiments, the source power may be operated in a continuous wave mode or pulsed mode while the bias power is operated in a pulsed mode. A pulsing frequency for the source power, the bias power, or both may be less than or about 500 Hz, and may be less than or about 450 Hz, less than or about 400 Hz, less than or about 350 Hz, less than or about 300 Hz, less than or about 250 Hz, less than or about 200 Hz, less than or about 150 Hz, less than or about 100 Hz, less than or about 75 Hz, less than or about 50 Hz, or less. The duty cycle of the source power, the bias power, or both may be less than or about 75%, such as a duty cycle of less than or about 70%, less than or about 60%, less than or about 50%, less than or about 40%, less than or about 30%, less than or about 25%, less than or about 20%, or less. By operating the source power, the bias power, or both for a reduced duty cycle, such as an on-time duty of less than or about 50%, a greater amount of time per cycle may be performing a more isotropic etch within the feature 440, which may better remove material from mask material 420 and may better maintain etch rate, circularity, and uniformity. Furthermore, a duty cycle of less than or about 50% may reduce a bow in the material during the etch.

During the etching operation, intermittent flash steps may be performed to maintain the feature 440 and/or remove material during from the feature 440 or the boron-and-nitrogen-containing material 425 during the etch. The flash steps may prevent clogging of the apertures 430 in the boron-and-nitrogen-containing material 425, which may clog from oxygen effluents from the etch depositing on the material/forming boron oxide material. Additionally, the flash steps may prevent or reduce cloaking of the apertures 430, as well as remove any bottom impediment in the features 440, such as boron oxide material. During the flash steps, a flow of the oxygen-containing precursor may be halted or reduced at optional operation 325. By halting the flow of the oxygen-containing precursor, interaction between the precursor used for etching for flashing may be eliminated or reduced.

A halogen-containing precursor may be provided at operation 330. The halogen-containing precursor may be any halogen-containing material that may provide a halogen during plasma dissociation to remove material from the apertures 430 in the boron-and-nitrogen-containing material 425, such as oxidized material in the apertures 430, or oxidized material in apertures 440 of the mask material 420. For example, exemplary halogen-containing materials may include fluorine, chlorine, or bromine. Exemplary halogen-containing materials may include fluorine, and may include carbon fluorides, such as $CF_4$, $C_4F_6$, hydrofluorocarbons, or any other material that may include one or more halogen atoms in the structure.

At operation 335, the method 300 may include forming plasma effluents of the halogen-containing precursor. Semiconductor structure 400 may be contacted with the plasma effluents at operation 340, which may perform an etch or removal of oxidized portions of the boron-and-nitrogen-containing material 425 and/or the mask material 420 at operation 345. The plasma effluents may also remove portions of boron that have redeposited at the bottom of the features 440. Plasma radicals of the halogen-containing precursor or fluorine-containing precursor, such as $CF_x$ radicals, may etch boron-and-oxygen containing material that may form on the boron-and-nitrogen-containing material 425 during etch processes. Fluorine atoms may also etch boron-and-oxygen containing material, but at a slower rate than $CF_x$ radicals. Hydrogen from hydrofluorocarbon gas may suppress the formation of free fluorine, which may be less effective at removing oxide. The $CF_x$ radicals and fluorine atoms may also etch front oxidation toward within the feature 440 extending into the mask material 420.

Depending on the thickness of the mask material 420, multiple flash steps may be necessary to ensure efficient etching and removal of material. However, compared to conventional masks for etching mask material 420, such as silicon oxynitride anti-reflective coatings, the present embodiments may require fewer flash steps, which may increase throughput. For example, with a mask material 420 thickness of greater than or about 3,000 nm, less than five flash steps, such as less than four flash steps, less than three flash steps, less than two flash steps, or even one flash step may be necessary to maintain the aperture 430 and/or feature 440 during etching. However, it is contemplated that the method 300 may be repeated multiple times, such as at least twice.

Process conditions during the flash steps of the method 300 may be the same as the process conditions for the etch operation of the method 300. However, it is contemplated that process conditions may be adjusted within the ranges previously described. Additionally, the flash steps may be performed in the same processing chamber or in a different processing chamber than the etch operation.

Process parameters including, but not limited to, precursor selection, temperature, pressure, and plasma power may allow the total etch time, bow critical dimension, local critical dimension uniformity (LCDU), and circularity to be tailored during the process. For example, while dependent on the depth to be etched, the total etch time may be less 30 minutes for a depth of greater than or about 3,000 nm. The bow critical dimension of the features 440 may be less than or about 125 nm, such as less than or about 120 nm, less than or about 115 nm, less than or about 110 nm, less than or about 105 nm, less than or about 100 nm, or less. The LDCU of the features 440 may be less than or about 10 nm, such as less than or about 9 nm, less than or about 8 nm, less than or about 7 nm, less than or about 6 nm, less than or about 5 nm, less than or about 4 nm, less than or about 3 nm, or less. The circularity of the features 440 may be less than or about 1.5, such as less than or about 1.4, less than or about 1.3, less than or about 1.2, less than or about 1.1, less than or about 1.09, less than or about 1.08, less than or about 1.07, less than or about 1.06, less than or about 1.05, less than or about 1.04, less than or about 1.03, or less.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing an oxygen-containing precursor to a processing region of a semiconductor processing chamber;
forming a plasma of the oxygen-containing precursor to produce oxygen-containing plasma effluents, wherein the oxygen-containing plasma effluents are formed at a source plasma power of less than or about 5,000 W;
applying a bias power while forming the oxygen-containing plasma effluents, wherein the bias power is greater than or about 2,000 W;
contacting a substrate housed in the processing region with the oxygen-containing plasma effluents, wherein the substrate comprises a boron-and-nitrogen-containing material overlying a carbon-containing material, and wherein the boron-and-nitrogen-containing material comprises a plurality of openings; and
etching the carbon-containing material.

2. The semiconductor processing method of claim 1, wherein the oxygen-containing precursor comprises diatomic oxygen.

3. The semiconductor processing method of claim 1, wherein the openings in the boron-and-nitrogen-containing material comprise circular apertures.

4. The semiconductor processing method of claim 1, wherein:
the substrate further comprises alternating layers of oxide and nitride materials; and
the carbon-containing material is disposed over the alternating layers of oxide and nitride materials.

5. The semiconductor processing method of claim 1, wherein a temperature in the semiconductor processing chamber is maintained at between about −50° C. and about 250° C.

6. The semiconductor processing method of claim 1, further comprising:
halting a flow of the oxygen-containing precursor;
providing a fluorine-containing precursor to the processing region of the semiconductor processing chamber;
forming a plasma of the fluorine-containing precursor to produce fluorine-containing plasma effluents;
contacting the substrate with the fluorine-containing plasma effluents; and
etching oxidized portions of the boron-and-nitrogen-containing material, oxidized portions of the carbon-containing material, or both.

7. The semiconductor processing method of claim 6, wherein the fluorine-containing precursor is a hydrofluorocarbon.

8. A semiconductor processing method comprising:
i) forming a plasma of an oxygen-containing precursor to produce oxygen-containing plasma effluents;
ii) contacting a carbon-containing material with the oxygen-containing plasma effluents, wherein a discontinuous boron-containing material overlies the carbon-containing material;
iii) selectively etching the carbon-containing material relative to a boron-containing material;
iv) forming a plasma of a fluorine-containing precursor to produce fluorine-containing plasma effluents;

v) contacting oxidized portions of the boron-containing material, oxidized portions of the carbon-containing material, or both with the fluorine-containing plasma effluents; and
vi) etching oxidized portions of the boron-containing material, oxidized portions of the carbon-containing material, or both.

9. The semiconductor processing method of claim 8, wherein a pressure is maintained at less than or about 1 Torr.

10. The semiconductor processing method of claim 8, wherein the oxygen-containing plasma effluents are formed at a duty cycle of less than or about 70%.

11. The semiconductor processing method of claim 8, wherein:
the etching forms a plurality of holes in the carbon-containing material; and
the plurality of holes are each characterized by a circularity of less than or about 1.5.

12. The semiconductor processing method of claim 8, wherein
the boron-containing material is characterized by a first thickness;
the carbon-containing material is characterized by a second thickness; and
the second thickness is greater than the first thickness.

13. The semiconductor processing method of claim 8, wherein operations i) through vi) are repeated at least two times.

14. A semiconductor processing method comprising:
providing a fluorine-containing precursor to a processing region of a semiconductor processing chamber, wherein the fluorine-containing precursor comprises a hydrofluorocarbon;
forming a plasma of the fluorine-containing precursor to produce fluorine-containing plasma effluents;
contacting a substrate with the fluorine-containing plasma effluents, wherein the substrate comprises a boron-and-nitrogen-containing material overlying a carbon-containing material, wherein the boron-and-nitrogen-containing material comprises a plurality of openings, wherein the carbon-containing material comprises a plurality of holes in alignment with the plurality of openings, and wherein portions of the boron-and-nitrogen-containing material, the carbon-containing material, or both are oxidized; and
etching oxidized portions of the boron-and-nitrogen-containing material, the oxidized portions of the carbon-containing material, or both.

15. The semiconductor processing method of claim 14, wherein the carbon-containing material comprises a carbon-containing hardmask.

16. The semiconductor processing method of claim 14, further comprising:
providing an oxygen-containing precursor to the processing region of the semiconductor processing chamber, wherein the oxygen-containing precursor comprises diatomic oxygen;
forming a plasma of the oxygen-containing precursor to produce oxygen-containing plasma effluents;
contacting the substrate housed in the processing region with the oxygen-containing plasma effluents; and
etching the carbon-containing material, wherein the etching forms the oxidized portions of the boron-and-nitrogen-containing material, the oxidized portions of the carbon-containing material, or both.

17. The semiconductor processing method of claim 14, wherein:

the plurality of holes are characterized by:
   a circularity of less than or about 1.5;
   a bow critical dimension (CD) of less than or about 125
      nm; and
   a local critical dimension uniformity (LCDU) of less
      than or about 10 nm.

\* \* \* \* \*